United States Patent [19]
Wasa et al.

[11] 3,988,232
[45] Oct. 26, 1976

[54] METHOD OF MAKING CRYSTAL FILMS

[75] Inventors: Kiyotaka Wasa, Nara; Kenzo Ohji, Hirakata; Osamu Yamazaki, Suita; Shigeru Hayakawa, Hirakata, all of Japan

[73] Assignee: Matsushita Electric Industrial Co., Ltd., Osaka, Japan

[22] Filed: June 13, 1975

[21] Appl. No.: 586,754

[30] Foreign Application Priority Data
June 25, 1974 Japan................................ 49-73057
June 27, 1974 Japan................................ 49-74108

[52] U.S. Cl............................... 204/192; 204/298
[51] Int. Cl.²........................................ C23C 15/00
[58] Field of Search ............. 204/192, 298; 427/100

[56] References Cited
UNITED STATES PATENTS

| | | |
|---|---|---|
| 3,420,763 | 1/1969 | Polito et al. .......................... 204/192 |
| 3,528,902 | 9/1970 | Wasa et al. .......................... 204/192 |
| 3,558,351 | 1/1971 | Foster .............................. 204/192 X |
| 3,669,871 | 6/1972 | Elmgren et al. ..................... 204/298 |
| 3,766,041 | 10/1973 | Wasa et al. .......................... 204/192 |

OTHER PUBLICATIONS

T. Hada et al, "Structures & Electrical Properties of Zinc Oxide Films Prepared by Low Pressure Sputtering System", *Thin Solid Films*, vol. 7, pp. 135–145 (1971).

*Primary Examiner*—John H. Mack
*Assistant Examiner*—Aaron Weisstuch
*Attorney, Agent, or Firm*—Wenderoth, Lind & Ponack

[57] ABSTRACT

A crystal film such as a piezoelectric crystal film is formed by sputtering of source material which is in the form of a convex curved surface or a polyhedral surface, and the formed film has crystallographic properties which can be very well controlled.

13 Claims, 6 Drawing Figures

METHOD OF MAKING CRYSTAL FILMS

BACKGROUND OF THE INVENTION

This invention relates to an improved method of making crystal films, and more particularly it relates to an improved method of making piezoelectric films with a high electro-mechanical coupling coefficient by using a cathodic sputtering step, the films being especially useful for manufacturing thin film acoustic devices.

Crystal films have been used widely for making solid state devices, and crystal films having piezoelectric characteristics are usable for fabricating thin film acoustic devices. Various films having piezoelectric characteristics such as films of ZnO, ZnS, ZnSe, CdS, CdSe, AlN GaN, $LiNbO_3$ and the sillenite family of bismuth oxides have been investigated by various workers, which films have been formed by means of vacuum evaporation, chemical vapor deposition or cathodic sputtering. These piezoelectric films, however, cannot be used in practice for the production of acoustic devices because their crystallographic properties cannot be controlled with high reproducibility.

SUMMARY OF THE INVENTION

Therefore, it is an object of the present invention to provide a novel and improved method of making crystal films wherein the crystallographic properties of the films can be controlled very well.

Another object of the present invention is to provide a novel and improved method of making piezoelectric films wherein the crystallographic and piezoelectric properties thereof can be controlled very well.

Still another object of the present invention is to provide a novel and improved method of making thin film acoustic devices by using a cathodic sputtering step.

These objects are realized by the method in accordance with the present invention, which comprises a step of depositing a crystal film by evaporation of source material and which is characterized by the fact that the surface of the source material is in the form of a convex curved or polyhedral surface.

BRIEF DESCRIPTION OF THE DRAWINGS

These and other objects and features of the present invention will become apparent from consideration of the following detailed description of the preferred embodiments of the invention and the attached drawings, wherein.

DESCRIPTION OF THE PREFERRED EMBODIMENTS

Before describing an embodiment of the method of the invention, a conventional system is briefly described in the following for making it easy to understand the features of the invention.

Figure 1:
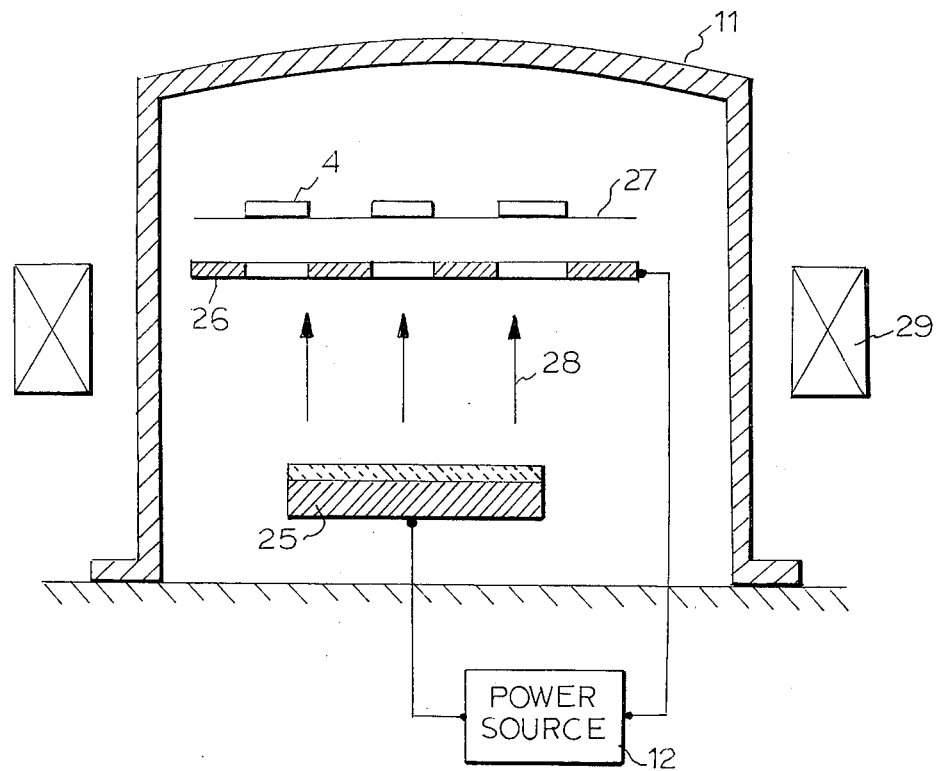
FIG. 1 is a schematic cross sectional view of a conventional planar diode sputtering system, which is shown for comparison with the system of the invention and for explanation thereof.

FIG. 1 shows a conventional planar diode rf-sputtering system, comprising a disk-shaped cathode 25 and a disk-shaped anode 26 which are arranged inside of a container 11. The cathode 25 is comprised of source materials. Substrates 4 are positioned on a holder 27 facing the cathode 25, and a magnetic field is created by magnetic coil 29 in a direction, as shown by arrows 28, parallel to the direction of an electric field provided by a power source 12.

When a piezoelectric film is formed on the substrate 4, for example by using ZnO as the source material, by means of such a conventional sputtering system, there is a problem that the crystallographic properties, and thus the piezoelectric properties, of the film cannot be controlled with good reproduciblity even under the same sputtering conditions, as described hereinbefore.

According to the method of the invention, these conventional problems can be solved. That is, now referring to FIG. 2 which shows the basic arrangement of the deposition system in accordance with the method of the invention, the surface of the source material 1, which is to be deposited on substrates 4 by sputtering thereof for making crystal films in accordance with the present invention, has the form of a convex curved surface 2, as shown in FIG. 2A, or a polyhedral surface 3, as shown in FIG. 2B, and the substrates 4 are positioned facing the surface or surfaces of said source materials.

Figure 2A:
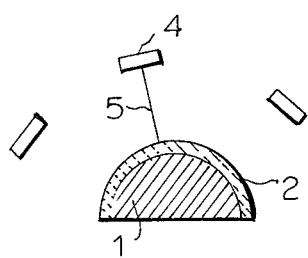
FIGS. 2A and 2B are schematic cross-sectional views of arrangements of source materials and substrates for making crystal films in accordance with the method of the present invention.
Figure 2B:
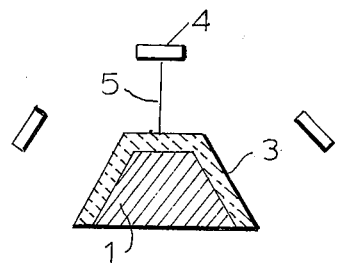

It has been discovered in accordance with the present invention that, in the deposition system of FIGS. 2A and 2B, the particles sputtering from said source materials form a beam-like flux 5 directed onto the substrates and this causes growth of highly oriented crystal films, under certain dimensional conditions. That is, for source materials having a convex curved surface 2, the ratio of the distance between the substrate and the surface of the source material to the radius of the curvature of the surface of the source materials should be 0.4 to 20 for obtaining such highly oriented crystal films. It has also been found that for source materials having a polyhedral surface, the ratio of the distance between the substrate and the surface of the source material to the radius of the curvature of the polyhedral surface envelope is also 0.4 to 20 for obtaining preferable crystal films which are highly oriented. When the ratio is smaller than 0.4, the resultant films have poor crystallographic orientation for both the convex curved surface and the polyhedral surface. A ratio larger than 20 is not usable because the size of the deposition system becomes undesirably large.

The method of depositing crystal films in the deposition system of FIGS. 2A and 2B, as described above, is very good for making crystal films having a piezoelectric characteristics, and so the method can be advantageously used for production of crystal films for thin film acoustic devices such as a thin film surface acoustic filter.

Further, in the method of the present invention, a cathodic sputtering step is very useful for the evaporation of said source materials. An rf-sputtering step is very convenient since various source materials can be evaporated.

Figure 3:
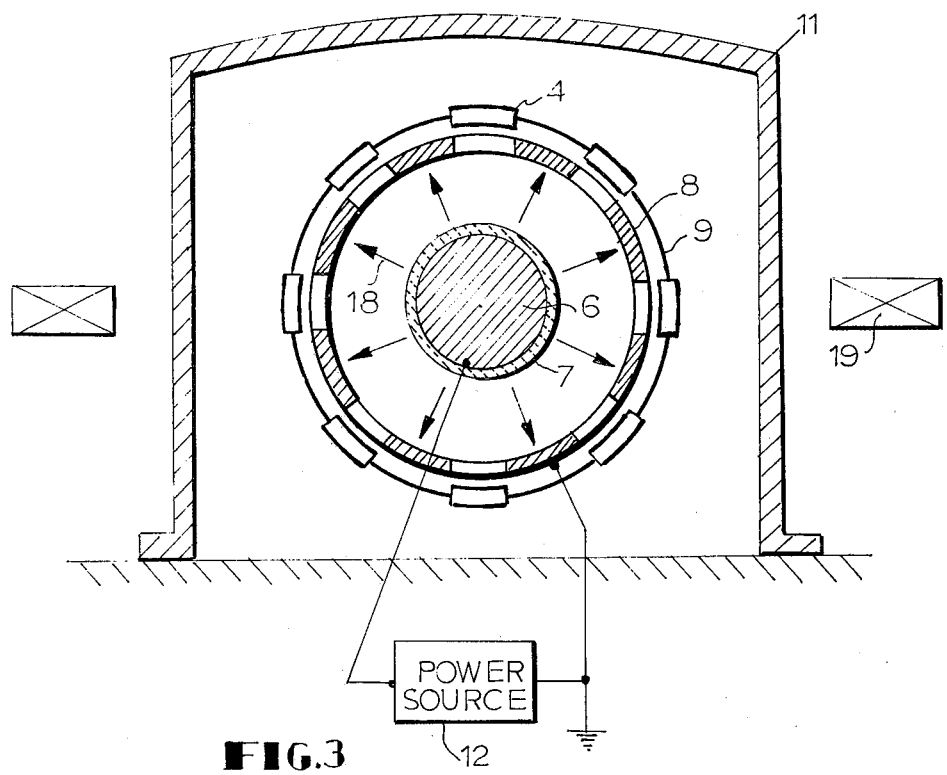
FIG. 3 is a schematic cross-sectional view of a concentric spherical electrode sputtering system in accordance with the present invention.

As a practical arrangement for carrying out the cathodic sputtering step of the method of the invention, a concentric spherical electrode sputtering system as shown in FIG. 3 is useful. Referring to FIG. 3, the concentric spherical electrode sputtering system in accordance with the present invention comprises an inner spherical cathode 6, an outer spherical anode 8 having apertures therein, and a spherical substrate holder 9 facing said cathode 6. The substrates 4 are positioned on said spherical substrate holder 9 at positions corresponding to said apertures. The surface 7 of said spherical cathode 6 is comprised of the piezoelectric materials. They are arranged inside of the bell jar container 11, and the bell jar 11 contains an ionizable gas. A high voltage power supply 12 is connected to said cathode 6 and said anode 8, and it causes a glow discharge between said cathode and said anode, whereby the sputtering evaporation of said source materials is carried out. The deposition system shown in FIG. 3 in accordance with the present invention can produce a plurality of crystal films having uniform thickness with good crystallinity, by one operation of sputtering evaporation.

Figure 4:
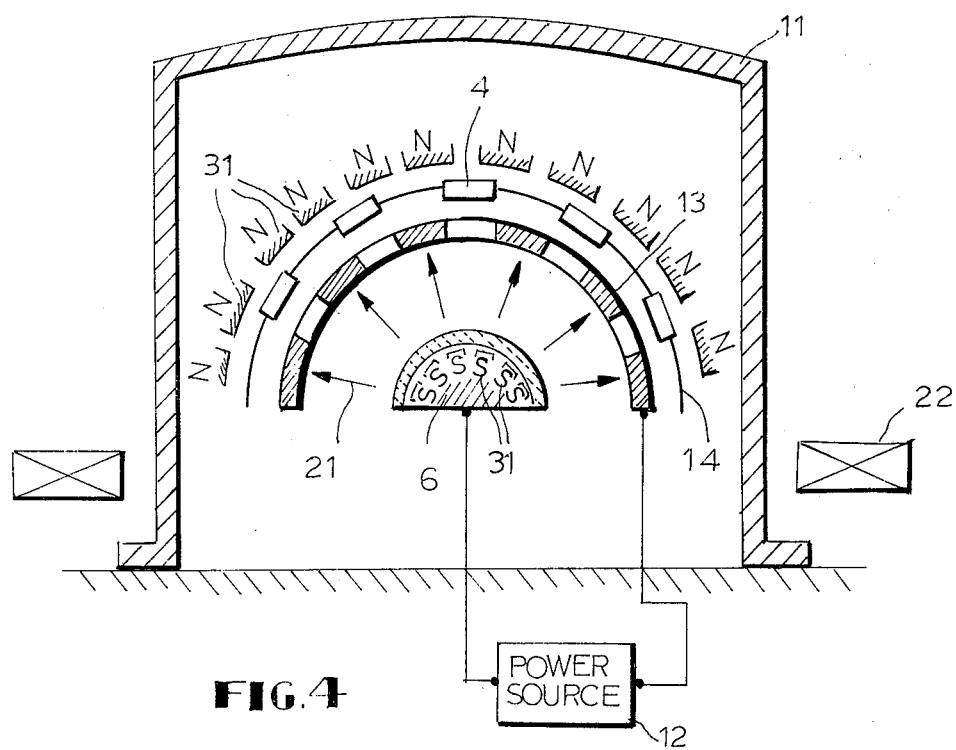
FIG. 4 is a schematic cross-sectional view of a concentric hemispherical electrode sputtering system in accordance with the present invention.

Further, a concentric hemispherical electrode sputtering system as shown in FIG. 4 is also usable for the cathodic sputtering step in accordance with the present invention. Referring to FIG. 4, the concentric hemispherical electrode sputtering system in accordance with the present invention comprises an inner hemispherical cathode 6, an outer hemispherical anode 13 having apertures therein, and a hemispherical substrates holder 14 on which substrates 4 are positioned facing said cathode 6 through said apertures. The concentric hemispherical electrode sputtering system of FIG. 4 is advantageous because the substrates can be set or reset on the substrate holder more conveniently than for the concentric spherical electrode sputtering system of FIG. 3. In addition, in the system of FIG. 4, the cathode, the anode and the substrate holder can be arranged more easily than in the system of FIG. 3, and so the former is more suitable for mass production.

Figure 5:
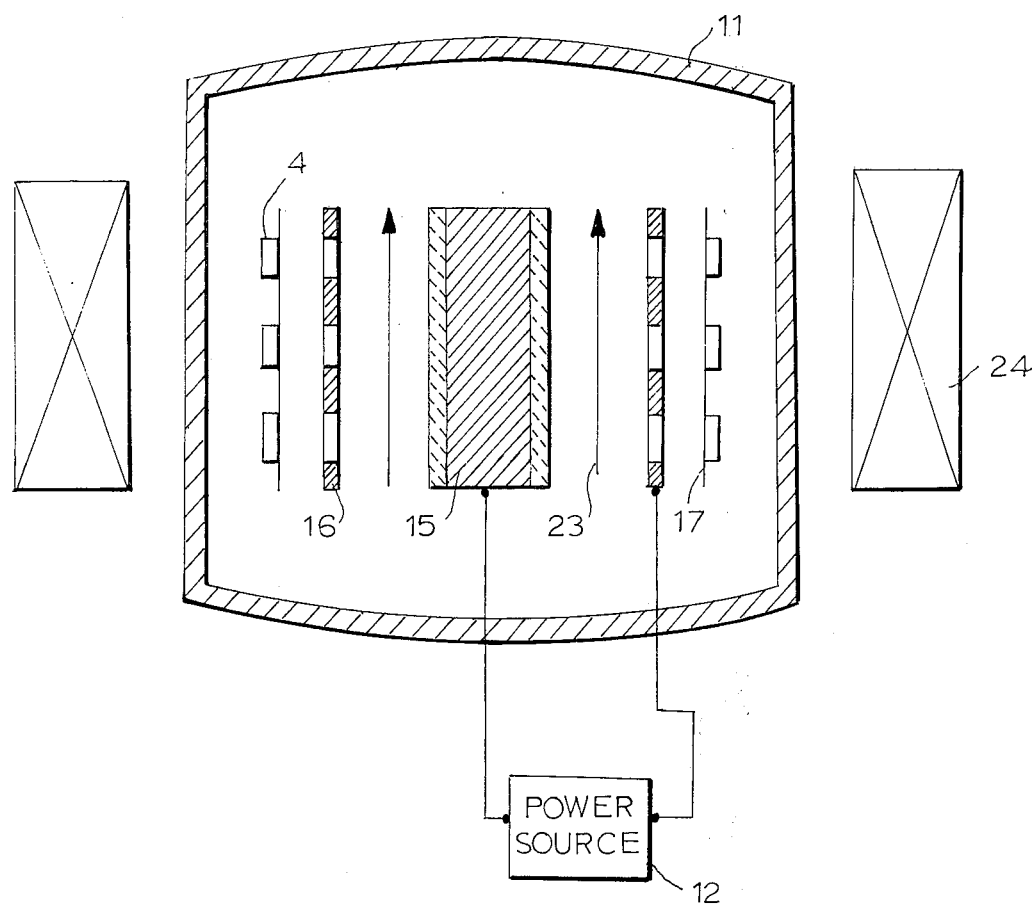
FIG. 5 is a schematic cross-sectional view of a coaxial cylindrical electrode sputtering system in accordance with the present invention.

Furthermore, a coaxial cylindrical electrode sputtering system shown in FIG. 5 is also usable as a cathodic sputtering system for mass production of thin crystal films. Referring to FIG. 5, the cylindrical electrode sputtering system comprises an inner cylindrical cathode 15, an outer cylindrical anode 16 having apertures therein, and a cylindrical substrate holder 17 on which substrates 4 are positioned facing said cathode 15 through said apertures. The coaxial cylindrical electrode system is also improved with respect to said concentric spherical electrode system of FIG. 3 from the standpoint of mass production. Many substrates can be processed in one cathodic sputtering step, when a long coaxial cylindrical electrodes sputtering system is employed. Furthermore, there is an advantage that multilayered crystal films can be obtained continuously with ease in only one cathodic sputtering step by using the coaxial cylindrical electrode system, wherein the composition of the cathode surface is varied along the axial direction and the substrates are moved in the axial direction of the system during said cathodic sputtering step.

In the method of the invention, it has been found that a high film growth rate can be achieved when a magnetic field is suitably applied. That is, for the concentric spherical electrode system of FIG. 3, a magnetic field applied in a radial direction 18, i.e. parallel to the electric field between the cathode 6 and the anode 8 promotes the film growth rate. The magnetic field is also found to support a more stable glow discharge at lower pressures in the cathodic sputtering system, thus providing highly reproducible mass production of sputtered crystal films. Such a magnetic field can be provided, for example, by using a short solenoid coil 19 arranged as shown in FIG. 3. The coil 19 can produce the magnetic field approximately in the radial direction 18 at the upper and lower portions of the concentric spherical electrode system.

In the concentric hemispherical electrode system, a magnetic field applied in a radial direction 21, i.e. parallel to the electric field between the cathode 6 and the anode 13 also promotes the film growth rate and makes possible film production with high reproducibility. Such a magnetic field can be obtained by using a short solenoid coil 22 arranged as shown in FIG. 4. The coil 22 can produce a magnetic field approximately in the radial direction 19 over almost the whole portion of the concentric hemispherical electrode system.

In the coaxial cylindrical electrode system, a magnetic field is applied in an axial direction 23, i.e. transverse to the electric field between the cathode 15 and the anode 16 for obtaining a high film growth rate and for promoting the film production with high reproducibility. The transverse magnetic field greatly increases the degree of ionization of the glow discharge, and so the operating gas pressure can be reduced to as low as $10^{-4}$ Torr or less. Such a magnetic field can be obtained by using a long solenoid coil 24 arranged as shown in FIG. 5. The coil 24 can produce a magnetic field in the axial direction in the coaxial cylindrical electrode system.

Further, instead of using a solenoid coil, it is also possible to employ permanent magnets arranged in a suitable construction for providing the magnetic fields described above in connection with FIGS. 3, 4 and 5. For instance, permanent magnets having the N,S poles 31 as shown in FIG. 4 can produce a magnetic field in the radial direction 21.

In accordance with the present invention, piezoelectric films, such as films of ZnO, $LiNbO_3$, the sillenite family of bismuth oxides, ZnS, ZnSe CdS, CdSe, AlN and GaN, are effectively produced by using a cathodic sputtering step, and the resultant films have good crystallographic properties with high reproducibility.

It has been also found that in accordance with the present invention, ionizable gas including inert gas is compatible with the nature of the cathode which comprises the source materials, and that for making films of ZnO, $LiNbO_3$, and the sillenite family of bismuth oxides, for example, ionizable gas comprising an oxidizing gas, such as oxygen, is usable. Similarly, for making films of AlN and GaN, an ionizable gas comprising a nitriding gas, such as nitrogen or ammonia gas, is usable; for making films of ZnS and CdS, an ionizable gas comprising a sulfiding gas, such as hydrogen sulfide, ammonium sulfide, sulfur gas, is usable; and for making films of ZnSe and CdSe, an ionizable gas comprising an inert gas, such as argon, krypton or xenon, is usable.

It is considered that the present invention will be more readily understood from the following specific example.

EXAMPLE

The hemispherical electrodes rf-sputtering system shown in FIG. 4 was used in the cathodic sputtering step, and for comparing the resultant films, a conventional planar diode rf-sputtering system shown in FIG. 1 was also used. ZnO was selected as the source material, and in both the systems, the substrates were kept at a temperature of 100° C. The ionizable gas used was a mixture of argon and oxygen wherein the oxygen concentration was 50% at a total gas pressure of 50 m torr.

The crystallographic properties of the resultant ZnO films were examined by a study of the reflection electron diffraction patterns and X-ray diffraction patterns. The spatial distribution of the oriented axis (c-axis) was evaluated from the half angular spread of the (002) arcs, and the inclination angle of the mean c-axis orientation with the substrate normal was also evaluated from the reflection electron diffraction patterns. The half-width of the (002) peak the in X-ray diffraction patterns was also evaluated. These results are tabulated in Table 1.

Table 1

| | Structural nature of ZnO films | |
|---|---|---|
| orientation | the present method | the conventional method |
| | single orientation (002) | mixed orientation (100) (002) (101) |
| spatial distribution (deg) | 7.5 ~ 9.0 | 10 ~ 14 |
| inclination angle (deg) | <3 | 3 ~ 12 |
| half-width (deg) | 0.35 ~ 0.50 | 0.8 ~ 1.3 |

From the results in Table 1, it is apparent that the present method provides highly oriented ZnO films (c-axis is perpendicular to the substrate plane) with good crystallinity, and that the structural nature of the films is not affected by the substrate position on the substrate holder. On the contrary, it is known that in the case of films prepared by the conventional method, different substrate positions on the substrate holder result in different structural natures, and so the resultant films give the widely spread data in Table 1. From the evaluation of the electro-mechanical coupling coefficient of the films, these results were also confirmed. That is, the films having a c-axis orientation showed an electro-mechanical coupling coefficient as high as 0.24 in a longitudinal wave mode, and this is higher than that with the films of mixed orientation prepared by the conventional method.

It has been found that the crystallographic orientation and electro-mechanical coupling coefficient of the films prepared by the present method are affected by the substrate temperature. A substrate temperature ranging from 60° to 250° C is found to be operable for making ZnO films having good film properties. At substrate temperatures above 250° C, the resultant films showed diffused and poor orientation and had a small electro-mechanical coupling coefficients. A substrate temperature below 60° C is not usable because the substrates would be cooled during the cathodic sputtering step.

It has also been found that an ionizable atmosphere at a pressure of 5 to 100 m Torr is operable for supporting a stable and uniform glow discharge between the cathode and the anode with a high film growth rate. At a pressure of below 5 m Torr and above 100 m Torr, the film growth rate is too small for mass production of the films.

It has also been found that the concentration of oxygen in the ionizable gas affects the nature of the deposited films. At oxygen concentrations above 80%, the resultant ZnO films have poor orientation, and at oxygen concentrations below 10%, the resultant ZnO films did not have any piezoelectric characteristics because of low electric resistivities. The operable oxygen concentration ranges from 10 to 80%.

By using these conditions in the hemispherical electrode rf-sputtering system, the distribution of the incident angles of the sputtered ZnO particles at the substrate surface can be made very much narrower than that obtained in the conventional planar diode rf-sputtering system. This causes the formation of a beam-like flux of the sputtered ZnO particles on the substrate, and results in the growth of ZnO films having a highly oriented c-axis. In the hemispherical electrode rf-sputtering system in accordance with the present invention, the film thickness and crystallographic structure are essentially uniform at all positions of the hemispherical substrate holder, and a high electro-mechanical coupling coefficient of the ZnO films can be achieved with high reproducibility. This shows that the hemispherical electrode rf-sputtering system of the invention is very useful for mass production of ZnO thin crystal films for thin film acoustic devices.

Besides the ZnO films, it has been found that other oxide compound films, such as $LiNbO_3$ and the sillenite family of bismuth oxides, can also be produced in the oxidizing atmosphere in accordance with the present invention. For nitride films such as AlN and GaN, an operable ionizable atmosphere is a mixed gas of the inert gas such as argon, krypton or xenon gas and a nitriding gas such as nitrogen or ammonia gas with a nitriding gas concentration of 10 to 80%. For sulfide films such as CdS and ZnS, an operable ionizable atmosphere is a mixed gas of an inert gas such as argon, krypton or xenon gas and a sulfiding gas such as hydrogen sulfide with a sulfiding gas concentration of 10 to 80%.

The example described hereinbefore shows the utility of rf-sputtering. However, any other sputtering process including dc-diode sputtering, dc-triode sputtering, magnetron type sputtering and ion-bombarment sputtering can also be used for the method of the invention. The method of the present invention is also applicable for making the crystal films by reactive sputtering. For example, sputtering from a Zn metal or an oxygen reduced ZnO cathode in an oxidizing atmosphere provides ZnO films; sputtering from an Al metal cathode in a nitriding atmosphere provides AlN films; and sputtering from a Cd metal cathode in a sulfiding atmosphere provides CdS films. Films having an inclined crystal-axis orientation can be also manufactured by angled sputtering in a way somewhat similar to oblique vacuum deposition.

What is claimed is:

1. In a method of making crystal films by simultaneously depositing said crystal films on a plurality of substrates by cathodic sputtering of a source material onto said substrates, the improvement comprising sputtering the source material from a surface of said source material which is in the form of a convex curved surface or a polyhedral surface and positioning said substrates so as to face said surface of said source material, the substrates being at a distance from the source material with the ratio of the distance between said substrates and said surface of said source material to the radius of the curvature of the surface of said source material having the form of the convex curved surface or to a radius of the envelope of the polyhedral surface of said source material having the form of the polyhedral surface being in the range of 0.4 to 20, said substrates being positioned on a substrate holder facing and spaced from an anode having apertures therein and wherein said sputtering step is effected by the cathodic sputtering of a source material comprising a cathode onto said substrate through the apertures of said anode.

2. The improvement as claimed in claim 1, wherein said cathodic sputtering is rf-sputtering.

3. The improvement as claimed in claim 1, wherein said cathode and said anode are concentric spherical electrodes, said cathode being an inner spherical cathode, the surface of which comprises said source material, said anode is an outer spherical anode having apertures therein, said substrates being positioned on a spherical holder facing said spherical cathode through said apertures in said spherical anode.

4. The improvement as claimed in claim 1, further comprising applying a magnetic field in a radial direction parallel to the direction of the electric field between said spherical cathode and said spherical anode.

5. The improvement as claimed in claim 1, wherein said cathode and said anode are concentric hemispherical electrodes, said cathode being an inner hemispherical cathode, the surface of which comprises said source material, said anode being an outer hemispherical anode having apertures therein, said substrates being positioned on a hemispherical substrate holder facing said hemispherical cathode through said apertures in said hemispherical anode.

6. The improvement as claimed in claim 5, further comprising applying a magnetic field in a radial direction parallel to the direction of the electric field between said hemispherical cathode and said hemispherical anode.

7. The improvement as claimed in claim 1, wherein said cathode and said anode are concentric cylindrical electrodes, said cathode being an inner cylindrical cathode, the surface of which comprises said source material, said anode being an outer cylindrical anode having apertures therein, said substrates being positioned on a cylindrical substrate holder facing said cylindrical cathode through said apertures in said cylindrical anode.

8. The improvement as claimed in claim 7, further comprising applying a magnetic field in an axial direction transverse to the direction of the electric field between said cylindrical cathode and said cylindrical anode.

9. The improvement as claimed in claim 1, wherein said cathode is comprised of a member selected from the group consisting of ZnO, LiNbO$_3$, bismuth oxide, ZnS, SnSe, CdS, CdSe, AlN and GaN.

10. The improvement as claimed in claim 1, wherein said cathode comprises ZnO, and said substrate is kept at a temperature ranging from 60° to 250° C during said cathodic sputtering step.

11. The improvement as claimed in claim 1, wherein said cathode comprises ZnO, and said cathodic sputtering is performed in an atmosphere comprising an ionizable gas in an oxidizing gas at a pressure ranging from 5 to 100 m Torr.

12. The improvement as claimed in claim 11, wherein said ionizable gas is a mixture of an inert gas and an oxidizing gas with said oxidizing gas being present in a concentration of 10 to 80%.

13. The improvement as claimed in claim 1, wherein the crystal film is a piezoelectric film.

* * * * *